United States Patent [19]
Kaplan et al.

[11] Patent Number: 5,154,970
[45] Date of Patent: Oct. 13, 1992

[54] HIGH TEMPERATURE RESISTANT RETICULATED FOAM STRUCTURE AND PROCESS

[75] Inventors: Richard B. Kaplan, Beverly Hills, Calif.; Hugh O. Pierson, Albuquerque, N. Mex.; Robert H. Tuffias, Los Angeles; Brian E. Williams, Chatsworth, both of Calif.

[73] Assignee: Ultramet, Pacoima, Calif.

[21] Appl. No.: 731,749

[22] Filed: Jul. 16, 1991

[51] Int. Cl.$^5$ .......................... B32B 3/26; C23C 16/00
[52] U.S. Cl. .................................. 428/304.4; 428/408; 428/312.6; 428/312.2; 428/216; 428/699; 427/249; 427/255.7
[58] Field of Search ............................ 427/249, 255.7; 428/306.6, 307.7, 312.6, 408

[56] References Cited

U.S. PATENT DOCUMENTS 4,863,798  9/1989  Arenz et al. .................. 428/368

*Primary Examiner*—George F. Lesmes
*Assistant Examiner*—Chris Raimund
*Attorney, Agent, or Firm*—Bruce A. Jagger

[57] ABSTRACT

A high temperature resistant reticulated porous foam structure for use as a diesel emission particulate trap. A reticulated porous foam substrate which is capable of maintaining its structural integrity at temperatures in excess of approximately 2500, and preferably 2700, degrees Fahrenheit is coated with a formed in situ oxidation resistant coating which extends substantially throughout the interstices of the porous foam structure. The coating comprises very thin alternate layers of silicon carbide and a carbide formed from a Group IVA metal which has a melting point in excess of approximately 1850 degrees Centigrade.

17 Claims, No Drawings

HIGH TEMPERATURE RESISTANT RETICULATED FOAM STRUCTURE AND PROCESS

The present invention relates to high temperature reticulated foam materials, and more particularly to rigid porous materials wherein a coating comprising a plurality of very thin alternating layers comprised of hafnium or zirconium carbide and silicon carbide is formed in situ on a temperature resistant skeletal substrate. Additional advantages may be achieved by the inclusion of hafnium or zirconium boride layers in the coating.

According to the present invention porous rigid structures are provided which are capable of withstanding many days exposure to an oxidizing environment at temperatures in excess of 2200 and preferably 2500 degrees Fahrenheit. The provided open pore structures are particularly adapted to withstand repeated exposures to wide fluctuations in temperature and environment such as are encountered in the use and regeneration of diesel particulate traps or filters. The low mass high pore volume reticulated structure has a high surface area to maximize trap efficiency and generally provides both thermal and electrically conductive paths within the body of the filter. Good thermal conductivity helps to reduce the presence of hot spots and thermal stress during use and regeneration. Good electrical conductivity permits the use of electrical heating for regeneration purposes. Permeability is maximized by this structure so that the effect of the exhaust treatment system on engine performance characteristics is minimized.

Previously considerable difficulty had been experienced in providing open pore rigid materials which are capable of withstanding the combination of high temperatures and oxidizing environments for long periods of time. Operating temperatures in excess of approximately 2200 to 2500 or even 2700 degrees Fahrenheit, particularly with repeated temperature cycling, had generally proven to be destructive within a matter of minutes of most materials which might otherwise have been useful as filters or traps in diesel, automotive or furnace exhaust applications. Further, those materials which were capable of withstanding such operating temperatures and cycling often deteriorated rapidly in oxidizing environments at lower temperatures.

In order to provide filters which can be regenerated by combustion, it is necessary to have materials which will withstand oxidizing environments at temperatures in excess of approximately 2200 and preferably 2500 to 2700 degrees Fahrenheit. Porous materials suitable for these purposes must withstand repeated exposure on a daily basis to these severe conditions for at least several months and preferably a year or more. In addition to maintaining its structural integrity under these severe conditions, a porous material must also have sufficient structural strength to retain its configuration and avoid breaking during normal use and handling. Additionally, the material must be an efficient trap or filter for a large volume of pollutants. In order to retain a large volume of polutants the pore volume should be as large as possible.

Many different pollution control problems are best solved by the use of filters which trap particulate material. Such filters must be regenerated from time to time or they will become clogged solid with trapped pollutants. Regeneration is often best accomplished by burning out the trapped material at relatively high temperatures. Such a combustion process elevates the temperature of the filter to very high levels for short periods of time. When the trapped material is particulate emissions from diesel, automotive or furnace exhaust the combustion temperatures in the regenerating process often exceed 2500 to 2700 degrees Fahrenheit. For other pollutants the regeneration temperatures often reach into the range of from approximately 2500 to 3000 degrees Fahrenheit or more. In general the combustion temperatures are higher when the filter is loaded to its fullest capacity. The nature of the trapped particulate material also influences the temperature of combustion as does the physical configuration of the trap or filter.

The ability of filters, according to the present invention, to withstand high regeneration temperatures permits these filters to be fully loaded between regenerations, to be used to trap a wide variety of pollutant materials, and to be used in many different configurations. The operating times, potential applications and utility are thus increased. Previous expedients generally required the use of relatively short operating cycles so as to reduce the amount of material in the trap at regeneration time. The utility of the previous filters was thus reduced to accommodate their inability to withstand high regeneration temperatures.

Temperature resistant open pored materials find wide utility outside of the pollution control area. Such materials are useful, for example, as catalyst beds.

Very few materials are capable of withstanding very high temperature oxidizing environments. Carbon and graphite will withstand very high temperatures. However, unprotected carbon begins to oxidize below 900 degrees Fahrenheit and oxidizes very rapidly as the temperature increases.

The use of unprotected carbon or graphite materials in applications where they are required to support a substance which is undergoing combustion is precluded by the low level of oxidation resistance which is inherent in these materials.

According to the present invention, these and other difficulties of the prior art have been overcome by way of a high temperature resistant open celled structure which is capable of withstanding prolonged temperatures in excess of approximately 2200, and preferably, 2500 to 2700 degrees Fahrenheit in an oxidizing environment. The open celled substrate generally contains from approximately 20 to 200, and preferably 50 to 120, pores per inch.

The structure comprises a high temperature resistant porous substrate coated with a high temperature oxidation resistant coating. In general the substrate is composed of material which oxidizes or burns when exposed to oxygen at high temperatures, but maintains its structural integrity at high temperatures in non-oxidizing environments. The coating is generally applied at high temperatures in non-oxidizing environments. The substrate must retain its structural integrity during the formation of the coating. If the substrate undergoes significant changes in shape or surface characteristics during at least the initial phases of the high temperature coating operation the resulting structure will generally be unsatisfactory.

The substrate serves as a skeleton to define the geometry of the structure. Once the coating is formed the skeleton has largely served its purpose. The substrate may even be partially or totally burned or leached out during use, leaving only the coating, so the coating preferably exhibits significant structural strength. If the substrate is to be removed it must be composed of a material which does not cause physical damage to the coating as it is removed.

The substrate must be sufficiently open so that the coating can be deposited substantially uniformly in situ throughout the substrate. In general the substrate has a density of from approximately 2 to 15, and preferably from approximately 3 to 10, weight percent density of theoretical solid substrate. There should be as much void volume within the body of the substrate as possible so as to minimize the pressure drop across the structure when it is in use. Also, there should be as much surface area as possible within the body of the substrate so that it will have a large capacity for trapping foreign substances.

In general the structures according to the present invention are most useful as filters. The geometry of the skeleton should provide a tortuous path for gas, liquid, suspension or other particulate bearing fluid that flows through the filter. The filter should be as light weight as possible so as to minimize the heat capacity of the structure. With a filter that has minimal heat capacity relatively little heat is required to heat it to the point where regeneration can occur. Also, a minimum amount of time is required for the filter to cool down after regeneration is complete. A skeleton of reticulated foamed carbon has been found to be particularly suitable for use as a substrate according to the present invention, although a carbon or ceramic mesh, matte, felt or loosely woven cloth may also be used.

The substrate preferably comprises a high temperature resistant substrate such as carbon, graphite, carbon-carbon composite, ceramic, cermet, foamed refractory metal or the like, which will accept a coating of a high temperature oxidation resistant coating. Carbon, ceramic and graphite are preferred where the coating application temperatures are expected to exceed approximately 2200 degrees Fahrenheit.

The physical form of the substrate is generally such that it does not have a thickness of more than approximately two inches in at least one dimension. Keeping the thickness to less than approximately two inches in at least one dimension permits the deposition by chemical vapor deposition techniques of coatings which are substantially uniform throughout the substrate. If greater thickness are required in certain applications they are generally achieved by stacking or bundling several separate substrates together. One convenient physical form for the substrates is that of a round disk having a thickness of approximately 1 to 2 inches and a diameter of from approximately 1 to 12 inches or more. Where extra filter capacity is required the disks are stacked to form a cylinder of the desired capacity. In another preferred form of the invention the filter is provided in the form of a hollow cored cylinder. In this form the wall thickness is less than about 2 inches. Cylinders may be stacked axially on one another to give an elongated filter of any length, or in the alternative they may bonded end to end before or after coating.

In general the coating systems according to the present invention comprise very thin alternate layers of hafnium or zirconium carbide and silicon carbide deposited preferably by chemical vapor deposition on a refractory substrate.

The oxidation resistant coating according to the present invention is comprised of formed in situ thin alternate layers of hafnium or zirconium carbide and silicon carbide. For added protection throughout a wider operating temperature range hafnium or zirconium boride layers may be included in the coating. Hafnium and zirconium are Group IVA metals which have melting points in excess of about 1850 degrees centigrade. Each of the thin alternate layers is generally no more than a few microns thick, preferably from approximately 0.1 to 5 microns, with a total thickness for the coating of preferably from approximately 0.5 to 5 mils. Coatings are generally thinner with substrates that have smaller pore sizes so as to avoid plugging up the filter with too much coating material.

The outermost layer of the coating, which is exposed to the surrounding environment, is generally preferably silicon carbide. The first layer of the coating forms an interlayer between the coating and the substrate. The interlayer is generally preferably silicon carbide where the substrate is carbon or graphite, but may be a different material particularly where a ceramic or other material is used as the substrate. If desired, the interlayer may be selected so as to minimize as much as possible the effect of the mismatch in the coefficients of thermal expansion between the coating and the substrate. Also, the interlayer may be selected so as to improve the adhesion of the coating to the substrate. The interlayer is generally thicker than the other layers so as to accommodate some irregularities in the surface of the substrate.

The coated structure generally has a density of from approximately 3 to 18, and, preferably, from approximately 4 to 12, weight percent of theoretical. In general the density of the coated structure is less than approximately 3 and preferably 2 gram per cubic centimeter.

The alternate layers of hafnium carbide and silicon carbide are applied to the porous refractory substrate by chemical vapor deposition. Although the individual alternate layers of silicon carbide and hafnium carbide are quite thin, it has been found that it is necessary to utilize alternate layers rather than coapplying these materials. Monolithic coatings comprised of codeposited silicon carbide and hafnium degrade much more quickly in high temperature oxidizing environments than do very thin alternating layers of these materials. Also, codeposits of these materials are difficult to form. Coatings consisting of hafnium carbide by itself are known to resist very high temperatures for short periods of time. Unfortunately, hafnium carbide coatings oxidize quickly so that at temperatures as low as 2500 degrees Fahrenheit the service life of a hafnium carbide coated structure is only a matter of thirty minutes or less.

According to the present invention, a coating system and fabrication process are provided which will permit long term operations at temperatures in excess of approximately 2200 and preferably 2500 degrees Fahrenheit in oxidizing environments. Additionally, short term protection is provided in excess of approximately 3000 degrees Fahrenheit.

In a preferred embodiment an open pore foamed carbon skeleton is formed according to conventional procedures for the preparation of such a structure. This structure has a thickness of about 1 inch, a density of about 6 weight percent, and about 100 pores per inch. The reticulated foamed structure is then placed within a reaction chamber where temperatures, pressures and the surrounding atmosphere may be controlled. The reaction chamber is sealed and purged with, for example, argon gas. The input gases for the desired reactions are preferably methyltrichlorosilane (MTS), hydrogen, chlorine, methane, argon and hafnium or zirconium tetrachloride. The hafnium or zirconium tetrachloride is preferably generated in the reaction chamber during the operation of the reactor by flowing chlorine gas through hafnium or zirconium metal which has been heated to at least approximately 950 degrees Fahrenheit. The argon is used to initially and finally purge the system, and as a diluent gas to control the deposition rate. The partial gas pressure is maintained at from approximately 5 to 500 torr. It is desirable to maintain the partial gas pressure as low as possible so as to accomplish uniform deposition throughout the interstices of the reticulated substrate. The substrate is placed in the reactor, preferably on a rotating support, and a thermocouple is attached to permit the monitoring of its temperature during the deposition process. The reactor is heated, preferably by induction, to the desired reaction temperature. The substrate which is the target of the deposition is heated to from approximately 2000 to 2600, and preferably from about 2150 to 2250 degrees Fahrenheit. The rate and nature of the deposit on the substrate are controlled by adjusting the various gas flow rates. A silicon carbide interlayer is formed between the substrate and the rest of the coating. Thin alternate layers of silicon carbide and hafnium or zirconium carbide are formed by adjusting the reactants in the reaction chamber. The conditions are adjusted so that there is little or no nucleation in the gas phase, that is, the formation of powders in the gas stream is avoided. A substantially uniform crack free coating is formed throughout the open pored structure. Comparable results are achieved by substituting other sources of silicon such as dichlorodimethylsilane in place of the methyltrichlorosilane, and other sources of hafnium or zirconium such as hafnium or zirconium chloride directly or fluorides or other hafnium or zirconium compounds may be used in place of the formed in situ chloride. As formed the coating exhibits very thin layers. After heating to above approximately 2500 degrees Fahrenheit in the presence of oxygen the layering no longer appears.

In a preferred embodiment the hafnium metal was heated to approximately 1020 degrees Fahrenheit and the 1 inch reticulated foamed carbon part to be coated was mounted on a rotating platform and heated by induction to about 2190 degrees Fahrenheit. The reaction chamber was purged with argon and the partial gas pressure was adjusted to about 20 torr. The methyltrichlorosilane was allowed to flow into the reaction chamber. The methyltrichlorosilane decomposed at the deposition temperature (the temperature to which the part was heated). The decomposition of the methyltrichlorosilane formed silicon carbide and hydrogen chloride. The silicon carbide was deposited as the initial coating on the carbon substrate. After approximately two minutes chlorine gas was flowed through the heated hafnium metal to produce a stream of hafnium tetrachloride. The hafnium tetrachloride reacted with the methyltrichlorosilane at the surface of the part, resulting in a hafnium carbide layer being deposited on top of the initial silicon carbide layer. The chlorine gas was then turned on and off at two minute intervals for a total deposition time of approximately four hours. Silicon carbide was deposited as the final layer on the outer surface of the formed in situ protective coating. The individual layers in the coating formed by this procedure were approximately one half to one microns thick and the total thickness of the coating was approximately 2 mils. The completed foamed structure had about 100 pores per inch. Repetition of this procedure using zirconium carbide produces comparable results. Likewise, repetition of this process with ceramic, niobium, and niobium alloy reticulated substrates produces satisfactory structures which are capable of operating in hazardous environments, but generally at temperatures below approximately 2200 degrees Fahrenheit and not in oxidizing environments. Some ceramic and metal alloys are useful in oxidizing environments.

Upon cooling it was observed that there were no microcracks in the coating on the foamed carbon substrate. Microscopic examination of a cross-section of the structure revealed the presence of very thin layers in the coating.

The coated structure thus prepared was subjected sequentially to temperatures of 2200, 2500 and 3050 degrees Fahrenheit in air for several hours. The weight loss of the sample was negligible. It was observed that there was a slight weight loss initially, probably due to the carbon skeleton burning out, with very little further weight loss after the first few hours. Microscopic examination of a cross-section of the coated substrate after heating showed that the layers were generally no longer visible except for the silicon carbide interlayer and what appeared to be a newly formed oxide layer on the outer surface of the coating. It is suspected that an oxide film forms during the initial exposure which inhibits any further oxidation of the coating. There was no evidence of spalling. The coating appeared to be substantially uniform throughout the body of the reticulated carbon foam. Substantially uniform coatings are achieved throughout the body of the porous foam structure at pore counts of from approximately 20 to 200 pores per inch.

Varying the chemical vapor deposition operating parameters permits adjustment of the thickness of the respective hafnium or zirconium carbide and silicon carbide layers. The individual layers, except for the interlayer, are generally from approximately 0.1 to 5, and preferably from about 0.5 to 3, microns in thickness, and the coating is generally from approximately 0.5 to 5, preferably about 1 to 3, mils in thickness. The interlayer may be as much as 20 microns or more, if desired. The layers need not be of uniform thickness. Where the substrate is carbon, it is preferred to have silicon carbide as the first in situ layer formed on the surface of the carbon and to have silicon carbide as the final layer which is exposed to the environment at the surface of the coating.

While carbon and graphite are the preferred substrate materials, the coating may be applied according to the present invention to other substrates including, for example, carbon-carbon composites, ceramics, cermets, titanium aluminides, refractory metals, and the like. For operating temperatures above 2500 degrees centigrade, in addition to carbon and graphite, niobium, niobium alloys and compounds and metal matrix materials may be used.

The substitution of zirconium carbide for hafnium carbide results in a satisfactory bi-layer protective coating when combined with silicon carbide as described above. Zirconium tetrachloride is used as the precursor. It is generated by flowing chlorine gas through zirconium metal which has been heated to about 550 degrees centigrade. The substrate temperature is maintained at from approximately 2000 to 2600 degrees Fahrenheit.

The substitution of hafnium or zirconium diboride in place of the hafnium carbide gives a protective bi-layer coating with silicon carbide which is satisfactory at operating temperatures up to about 2700 degrees Fahrenheit. Above approximately this temperature substantial and continuous weight loss occurs. Hafnium or zirconium diboride is deposited by reacting hydrogen and hafnium or zirconium chloride with boron trichloride or an alternative boron source such as diborane.

A tri-layered coating consisting of alternate layers of silicon carbide, hafnium or zirconium diboride and hafnium or zirconium carbide tends to exhibit an enhanced resistance to oxidation failure, particularly when extended operations in approximately the 1800 degrees Fahrenheit region are contemplated.

In a preferred embodiment for the preparation of a tri-layer coating a closed reactor is provided, hafnium metal is heated to approximately 1020 degrees Fahrenheit and a foamed open cell carbon substrate to be coated is placed in the reactor on a rotating pedestal and heated by induction to about 2190 degrees Fahrenheit. The partial gas pressure in the reactor is adjusted to about 20 torr. Methyltrichlorosilane (MTS) is allowed to flow into the reaction chamber. The MTS decomposes at the deposition temperature to form silicon carbide and hydrogen chloride. The silicon carbide is deposited as the initial coating on the substrate. When the initial silicon carbide coating has reached the desired thickness chlorine gas is flowed through heated hafnium metal to produce a stream of hafnium chloride. The hafnium chloride reacts with the MTS at the surface of the part to form a layer of hafnium carbide on top of the initial silicon carbide layer. After approximately two minutes the MTS is turned off and a mixture of boron trichloride and hydrogen gas are allowed to flow into the reactor for approximately two minutes. The boron trichloride and hydrogen react with the hafnium chloride at the surface of the part to form a hafnium boride layer on top of the hafnium carbide layer. After approximately two minutes this gas flow is turned off and the MTS is admitted for about two minutes to form another silicon carbide layer. The flows of reactants are thus alternated about every two minutes for a total of approximately one hour. The final layer is silicon carbide. The resulting coating exhibits enhanced resistance to failure from oxidization at approximately 1800 degrees Fahrenheit and is stable up to temperatures in excess of approximately 3000 degrees Fahrenheit. The use of zirconium instead of hafnium produces comparable results.

A porous reticulated carbon foam substrate having a coating of silicon-hafnium carbide prepared as described above was selected for use as a filter or trap on a diesel engine exhaust. Six disks were prepared and assembled into a single column to form one filter. Each disk was about 6 inches in diameter, about 1 inch thick and was provided with about a 1.5 inch hole in the middle to allow the passage of a threaded mounting rod. The disks had a density of about 8 weight percent and had about 80 pores per inch. The disks were assembled together in a holder and mounted in an exhaust stream from a light 5 speed manual shift truck. The exhaust stream flowed radially in through the trap and exited through the center.

Without a trap the baseline particulate emission for this vehicle was 0.177 grams per mile. The initial test with a clean trap gave a collection efficiency of about 18 percent with a trap differential of about 25 inches of water.

The efficiency and trap differential changed rapidly as the testing progressed. The vehicle was driven on the road for 200 miles to load the trap. The collection efficiency on the loaded trap was approximately 57 percent and the trap differential pressure was about 71 inches of water. The mass loading was about 21 grams of particulate material.

To initiate regeneration the vehicle was operated so as to achieve an exhaust temperature of about 580 degrees Centigrade and an exhaust oxygen concentration of about 16 percent. Regeneration began with a rapid exhaust temperature rise to above 1000 degrees Centigrade. The engine was shut off and allowed to sit for several minutes. Nothing more was required to accomplish regeneration.

After restarting the trap differential pressure was determined at a vehicle speed of about 40 miles per hour. The collection efficiency was about 52 percent with a differential pressure of about 30 inches of water, indicating a very good efficiency after regeneration. Based on the trap differential pressure the regeneration was about 75 percent. The regeneration was approximately optimum in that it was complete enough to permit the trap to be returned to extended service but not so complete as to return it to the original unused condition where efficiencies were very low.

The trap was disassembled and inspected. No evidence of melting was found. Two of the disks were cracked, apparently due to mechanical or thermal stress associated with the mounting of the disks in the holder. The cracks did not impair the efficiency of the filter.

Where the structure is to be used as a filter in an environment where the temperatures will not exceed 2200, and preferably 2000, degrees Fahrenheit, it is possible to use a monolithic coating of silicon carbide alone on the substrate. This filter structure will degenerate and fail quickly above approximately 2200 degrees Fahrenheit so it is suitable for use only in relatively low temperature filter applications.

What has been described are preferred embodiments in which modifications and changes may be made without departing from the spirit and scope of the accompanying claims.

What is claimed is:

1. A highly permeable high temperature resistant shaped structure capable of withstanding repeated cycling in an oxidizing environment to temperatures in excess of approximately 2200 degrees Fahrenheit comprising: a porous substrate comprising material which is capable of maintaining its structural integrity at temperatures in excess of approximately 2000 degrees Fahrenheit in the absence of oxygen, and a formed in situ structurally stable oxidation resistant coating extending substantially throughout the interstices of said permeable structure, said coating comprising very thin alternate layers of silicon carbide and a carbide formed from a Group IVA metal having a melting point in excess of approximately 1850 degrees Centrigrade, said alternate layers including at least two such layers of silicon carbide and two such layers of a carbide formed from said Group IVA metal.

2. A high temperature resistant porous structure of claim 1 wherein said substrate comprises porous carbon.

3. A high temperature resistant porous structure of claim 1 wherein said substrate comprises porous graphite.

4. A high temperature resistant porous structure of claim 1 wherein said substrate comprises porous metal.

5. A high temperature resistant porous structure of claim 1 wherein said substrate comprises porous carbon-carbon composite.

6. A high temperature resistant porous structure of claim 1 wherein said substrate comprises porous ceramic.

7. A high temperature resistant porous structure of claim 1 wherein said substrate comprises porous cermet.

8. A high temperature resistant porous structure of claim 1 wherein each of said layers is from approximately 0.1 to 5 microns thick.

9. A high temperature resistant porous structure of claim 1 wherein said coating is from approximately 0.5 to 5 mils thick.

10. A high temperature resistant porous structure of claim 1 wherein said substrate comprises a shaped porous foamed carbon structure having from approximately 20 to 200 pores per inch and a wall thickness in at least one dimension of less than approximately 2 inches.

11. A high temperature resistant porous structure of claim 1 wherein said structure has from approximately 20 to 200 pores per inch.

12. A high temperature resistant porous structure of claim 1 wherein said structure has a density of less than about 3 grams per cubic centimeter.

13. A high temperature resistant porous structure of claim 1 wherein said coating comprises alternate layers of silicon carbide, hafnium carbide and hafnium boride.

14. A high temperature resistant porous structure of claim 1 wherein said coating comprises alternate layers of silicon carbide and hafnium carbide.

15. A high temperature resistant porous structure of claim 1 wherein said coating comprises alternate layers of silicon carbide and zirconium carbide.

16. Process for forming a high temperature resistant porous structure capable of withstanding repeated cycles of cooling and heating to temperatures in excess of approximately 2200 degrees Fahrenheit in an oxidizing environment comprising: selecting a highly permeable substrate, and applying a high temperature oxidation resistant coating to said substrate at an application temperature in excess of approximately 2000 degrees Fahrenheit in a non-oxidizing environment, said coating comprising alternate thin layers of silicon carbide and a carbide formed from a Group IVA metal having a melting point in excess of about 1850 degrees centigrade, said porous substrate being composed of material which is capable of maintaining its structural integrity in the absence of oxygen at temperatures in excess of said application temperature, applying at least two of said silicon carbide layers and at least two of said layers of a carbide formed from said Group IVA metal.

17. A process of claim 16 wherein said applying comprises a chemical vapor deposition process.

* * * * *